(12) United States Patent
Walker

(10) Patent No.: US 8,820,609 B2
(45) Date of Patent: Sep. 2, 2014

(54) WIRE BONDING TOOL

(75) Inventor: Todd J. Walker, Huntington Beach, CA (US)

(73) Assignee: Orthodyne Electronics Corporation, Irvine, CA (US)

( * ) Notice: Subject to any disclaimer, the term of this patent is extended or adjusted under 35 U.S.C. 154(b) by 0 days.

(21) Appl. No.: 14/118,919

(22) PCT Filed: Sep. 13, 2012

(86) PCT No.: PCT/US2012/055101
§ 371 (c)(1),
(2), (4) Date: Nov. 20, 2013

(87) PCT Pub. No.: WO2013/112205
PCT Pub. Date: Aug. 1, 2013

(65) Prior Publication Data
US 2014/0103095 A1    Apr. 17, 2014

Related U.S. Application Data

(60) Provisional application No. 61/536,871, filed on Sep. 20, 2011.

(51) Int. Cl.
*B23K 1/06* (2006.01)
*B23K 37/00* (2006.01)

(52) U.S. Cl.
USPC ............................................ 228/4.5; 228/1.1

(58) Field of Classification Search
None
See application file for complete search history.

(56) References Cited

U.S. PATENT DOCUMENTS

| | | | | |
|---|---|---|---|---|
| 3,639,969 A | * | 2/1972 | Potin et al. | 29/408 |
| 3,934,783 A | * | 1/1976 | Larrison | 228/110.1 |
| 4,776,509 A | * | 10/1988 | Pitts et al. | 228/179.1 |
| 5,288,007 A | * | 2/1994 | Interrante et al. | 228/119 |
| 5,868,301 A | * | 2/1999 | Distefano et al. | 228/180.21 |
| 6,100,511 A | * | 8/2000 | Kempe | 219/679 |
| 6,286,746 B1 | * | 9/2001 | Egan et al. | 228/1.1 |
| 6,523,732 B1 | * | 2/2003 | Popoola et al. | 228/1.1 |
| 7,745,253 B2 | | 6/2010 | Luechinger | |
| 7,909,228 B2 | | 3/2011 | Delsman et al. | |
| 2002/0179686 A1 | * | 12/2002 | Shieh et al. | 228/180.5 |
| 2011/0290859 A1 | | 12/2011 | Delsman et al. | |
| 2013/0119111 A1 | * | 5/2013 | Delsman et al. | 228/1.1 |

FOREIGN PATENT DOCUMENTS

| | | | |
|---|---|---|---|
| FR | 2534834 A | * | 4/1984 |
| JP | 02-094646 A | * | 4/1990 |
| JP | 0661313 | | 3/1994 |
| JP | H1041334 | | 2/1998 |
| JP | 2000299347 | | 10/2000 |
| JP | 2011171676 | | 9/2011 |

OTHER PUBLICATIONS

International Search Report completed Jul. 10, 2013; International Patent Application No. PCT/US2012/055101.

* cited by examiner

*Primary Examiner* — Kiley Stoner
(74) *Attorney, Agent, or Firm* — Stradley Ronon Stevens & Young, LLP

(57) ABSTRACT

A wire bonding tool including a body portion terminating in a tip portion is provided. The tip portion includes opposing walls defining a groove, each of the opposing walls having a curved profile.

42 Claims, 12 Drawing Sheets

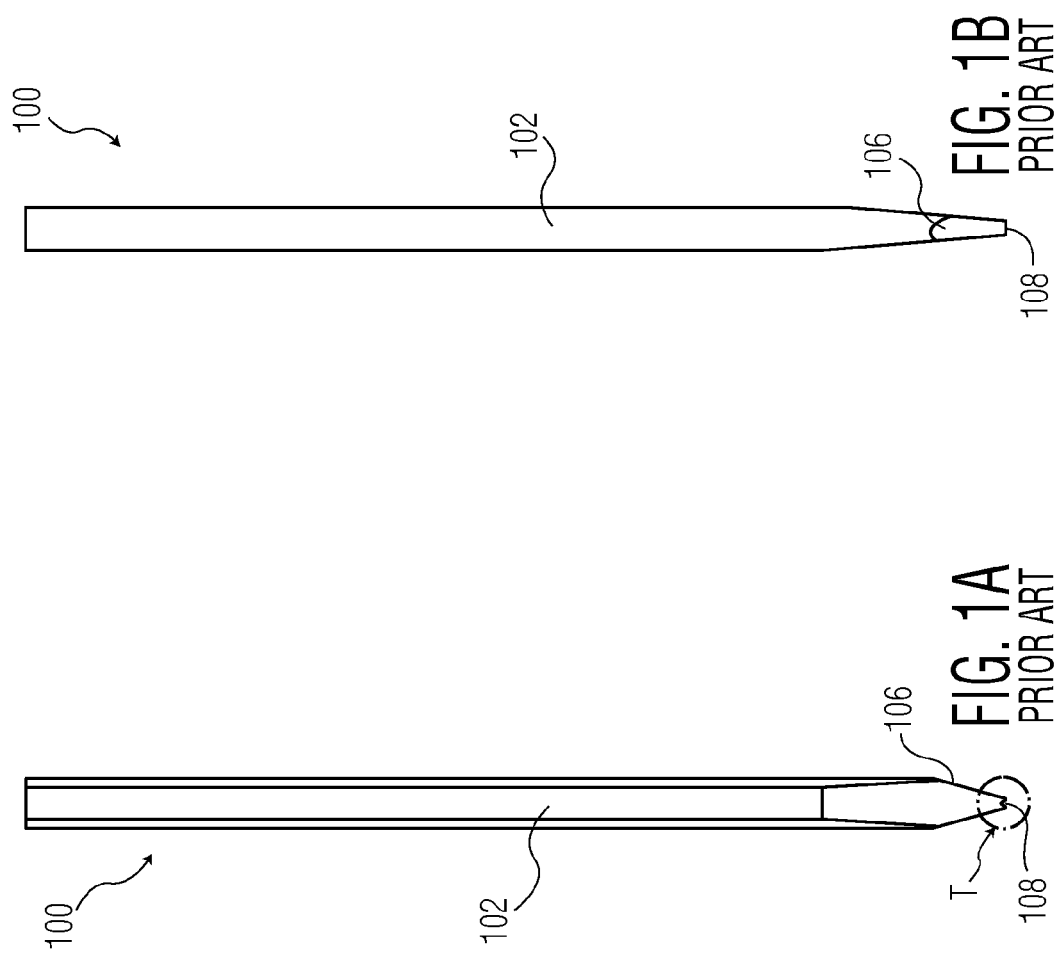

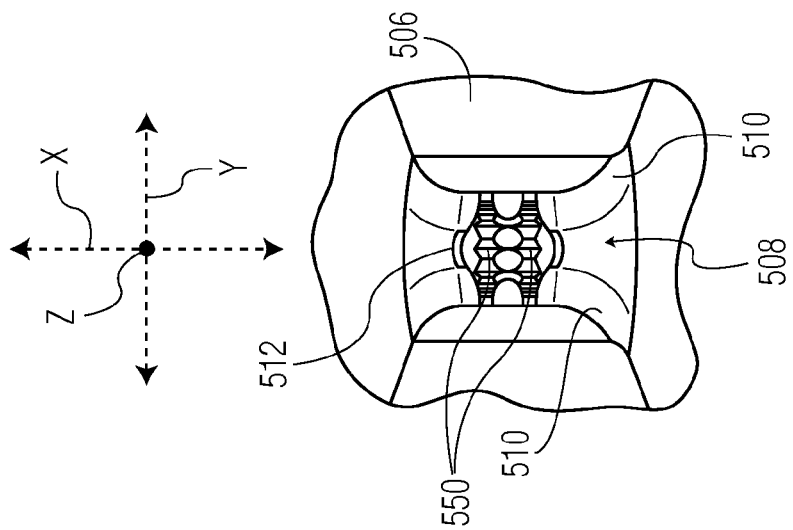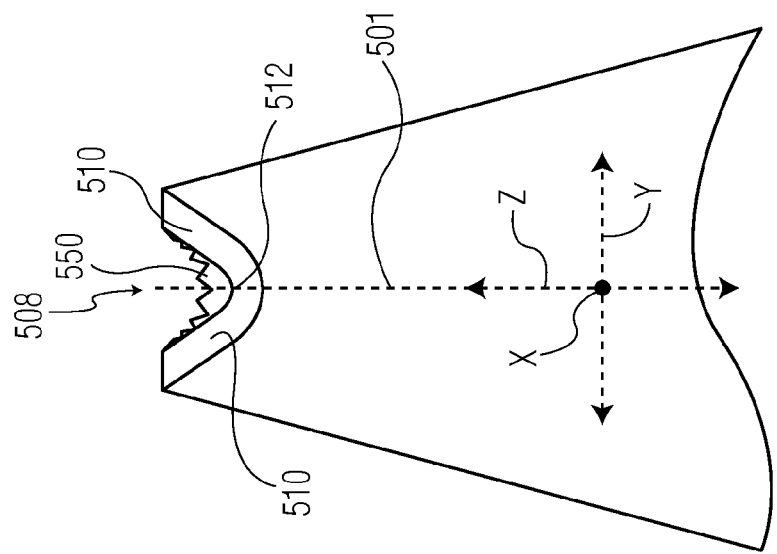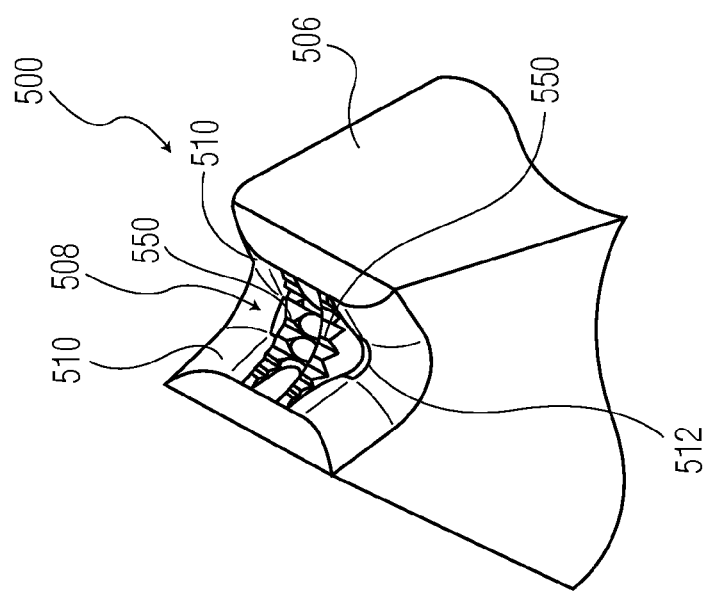

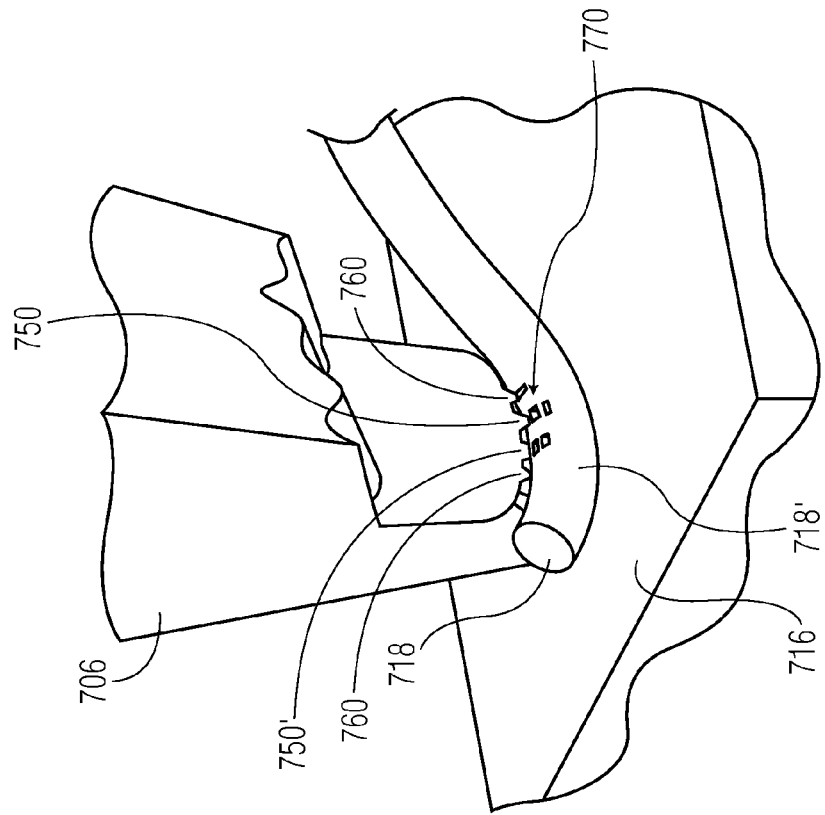
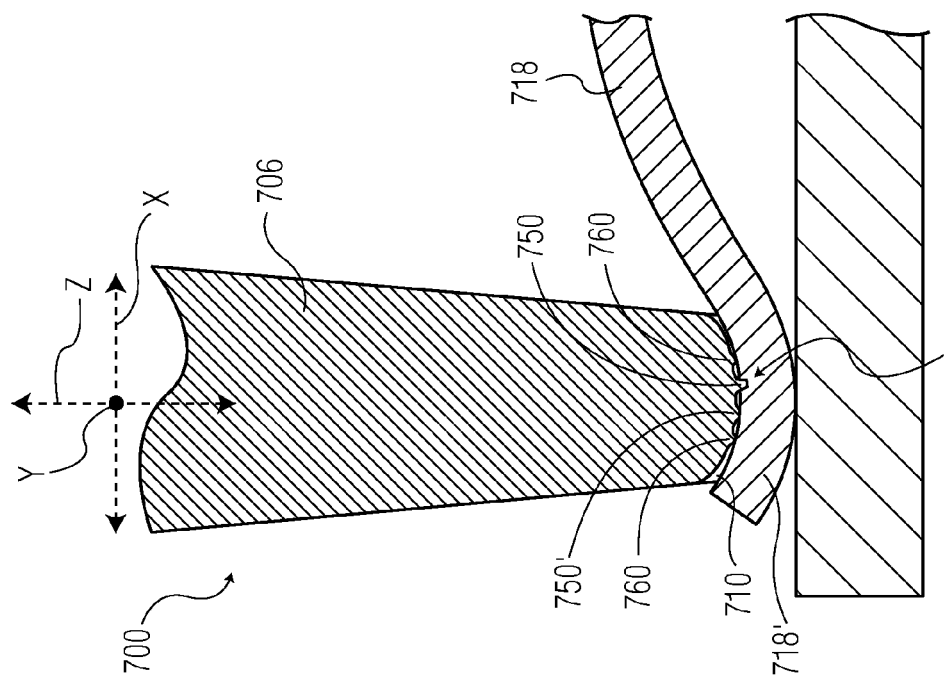
FIG. 7E
FIG. 7D

WIRE BONDING TOOL

CROSS-REFERENCE TO RELATED APPLICATIONS

This application claims the benefit of International Patent Application No. PCT/US2012/055101 filed on Sep. 13, 2012, which claims the benefit of U.S. Provisional Application No. 61/536,871 filed on Sep. 20, 2011, the content of both of which is incorporated herein by reference.

FIELD OF THE INVENTION

The present invention relates to bonding systems, and more particularly, to wedge tools for wire bonding systems.

BACKGROUND OF THE INVENTION

In the processing and packaging of semiconductor devices, ultrasonic wire bonding (e.g., ball bonding, wedge bonding, ribbon bonding, etc.) continues to be a widely used method of providing electrical interconnection between two locations (e.g., between a die pad of a semiconductor die and a lead of a leadframe). An upper end of a bonding tool is, in many instances, configured to be engaged in a transducer (e.g., an ultrasonic transducer) of an ultrasonic bonding system which causes the bonding tool to vibrate during bonding. Ultrasonic bonding is a joining process that, for example, may use relative motion between the wire and an underlying surface to facilitate bonding to that underlying surface.

Wedge bonding is one well known type of wire bonding. Certain wedge bonding tools include a lower tip portion that defines a groove at the terminal end of the tip portion. For example, as illustrated in FIGS. 1A-1B, wire bonding tool 100 includes body portion 102 that terminates in tip portion 106. Tip portion 106 defines inverted V-shaped groove 108 (within circle "T") which is defined by opposing walls (e.g., see FIGS. 2A-2C) and is adapted to receive a portion of a wire to be bonded.

FIGS. 2A-2C illustrate an enlarged view of tip portion 106/groove 108 of conventional wire bonding tool 100 shown in dashed circle "T" of FIG. 1A. Wire bonding tool 100 (including body portion 102) defines longitudinal axis 101 (e.g., along the Z-axis of a wire bonding machine). FIG. 2A illustrates tip portion 106 terminating in opposing walls 110 which define inverted V-shaped groove 108 with apex 112. FIG. 2B is a bottom-up view of FIG. 2A and illustrates walls 110 converging at apex 112 of groove 108. Groove 108 extends along a groove axis (the illustrated X-axis) with apex 112 defining a flat, or straight line, profile as illustrated in FIGS. 2A and 2C.

FIG. 2D illustrates conventional wire bonding tool 100 of FIG. 2C pressing engaged portion 118' of wire 118 against substrate 116 (e.g., a bonding location to which wire 118 is being bonded). As shown in FIG. 2D, wire portion 118' does not maintain complete contact with apex 112 of groove 108. That is, a gap G exists between apex 112 and wire portion 118'. Such a gap G tends to result in inefficient ultrasonic bonding of wire 118 to substrate 116 (e.g., wire portion 118' may slip relative to groove 108). Weaker bonds may be formed between wire 118 and substrate 116. Further, the gap G (and associated slipping) may reduce the useful life of conventional bonding tools.

Thus, it would be desirable to provide improved wedge bonding tool designs.

SUMMARY OF THE INVENTION

According to an exemplary embodiment of the present invention, a wire bonding tool is provided including a body portion terminating in a tip portion. The tip portion includes opposing walls defining a groove, and each of the opposing walls has a curved profile.

According to another exemplary embodiment of the present invention, a wire bonding tool is provided including a body portion terminating in a tip portion. The tip portion defines a groove configured to receive a length of wire, and the groove defines a substantially hyperbolic paraboloid shape.

According to another exemplary embodiment of the present invention, a wire bonding tool is provided including a body portion terminating in a tip portion. The tip portion includes opposing walls defining a groove, where at least one ridge extends between the opposing walls.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures:

FIGS. 1A-1B are front and side views, respectively, of a conventional bonding tool;

FIGS. 5A-5C are perspective, side, and bottom-up enlarged views, respectively, of a bonding tool tip portion in accordance with yet another exemplary embodiment of the present invention;

FIG. 7D is an enlarged side, cut away view, of the bonding tool tip portion of FIGS. 7A-7C engaging a portion of a wire to be bonded to an underlying substrate in accordance with an exemplary embodiment of the present invention;

FIG. 7E is a perspective, partial cut away view, of the bonding tool tip portion engaging a portion of a wire from FIG. 7D, in accordance with an exemplary embodiment of the present invention.

DETAILED DESCRIPTION OF THE INVENTION

Figure 2C:
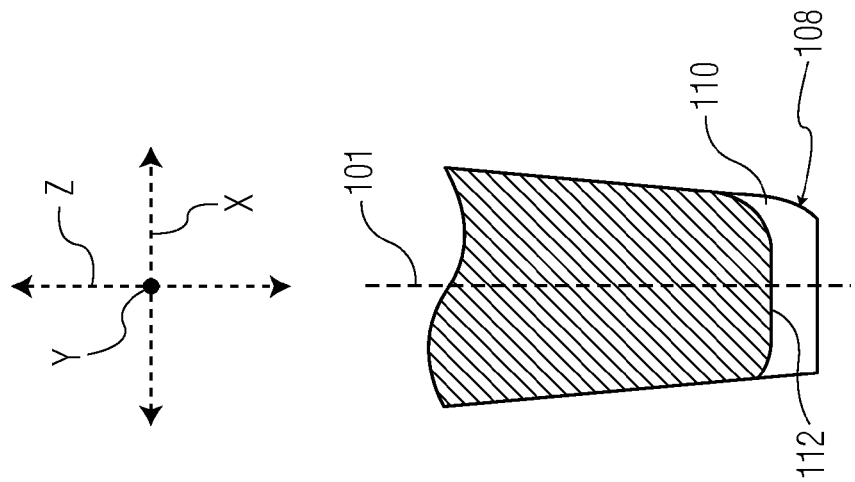
FIGS. 2A-2C are various enlarged views of a tip portion of the bonding tool of FIGS. 1A-1B.
Figure 2B:
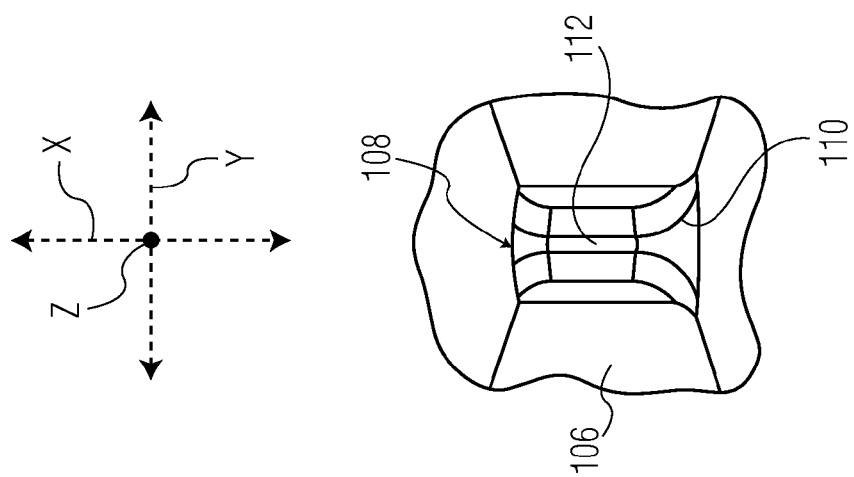

According to various exemplary embodiments of the present invention, an improved wire bonding tool is provided. The tip portion of the tool includes opposing walls that define a groove adapted to receive a wire to be bonded to an underlying substrate. Various features (which are not mutually exclusive of one another) may be provided in the groove. For example, the opposing walls may each have a curved profile. Further, the apex of the groove may follow a curved path/profile. Further still, the groove may have a substantially hyperbolic paraboloid shape. Further still, at least one ridge may extend between the opposing walls of the groove. Such features may provide improved coupling between the bonding tool and a wire to be bonded, reducing the potential for relative movement between the engaged wire portion and the groove, and thereby improving the strength of an ultrasonic bond formed between the wire and a bonding location.

While FIGS. 1A-1B illustrate conventional bonding tool 100 with groove 108 (as detailed in FIGS. 2A-2D), a bonding tool in accordance with one or more embodiments of the present invention may appear to have much of the same basic structure shown in FIGS. 1A-1B (i.e., a body portion terminating in a tip portion as shown in FIGS. 1A-1B). The primary difference between conventional bonding tool 100 and the various inventive tools described herein, relates to the tip portion, and more specifically, the groove defined by the tip portion. For example, FIGS. 3A-3D illustrate enlarged views of tip portion 306 of wire tool 300 that defines longitudinal axis 301. Opposing walls 310 define groove 308 (having apex 312), and are substantially symmetrical about axis 301. Groove 308 is configured to engage portion 318' of wire 318 (e.g., see FIG. 3D) during a wire bonding operation. As one skilled in the art will appreciate, the dimensions and geometry of tip portion 306 may be altered for differing sizes of wire to be used in such wire bonding operations. Wire bonding tool 300 may be comprised of a number of materials such as tungsten carbide, silicon carbide, amongst others.

Figure 2A:
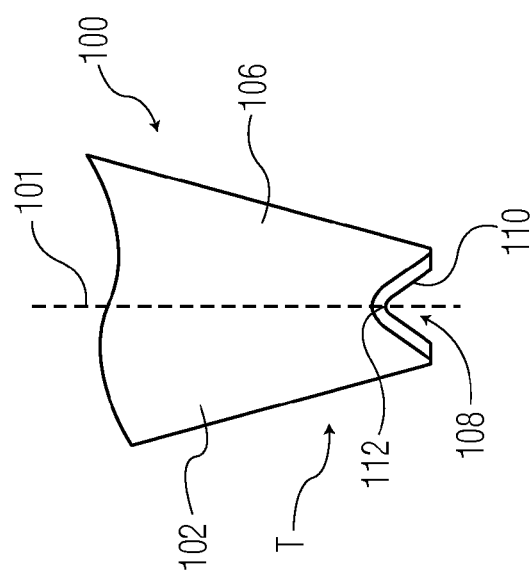
Figure 3C:
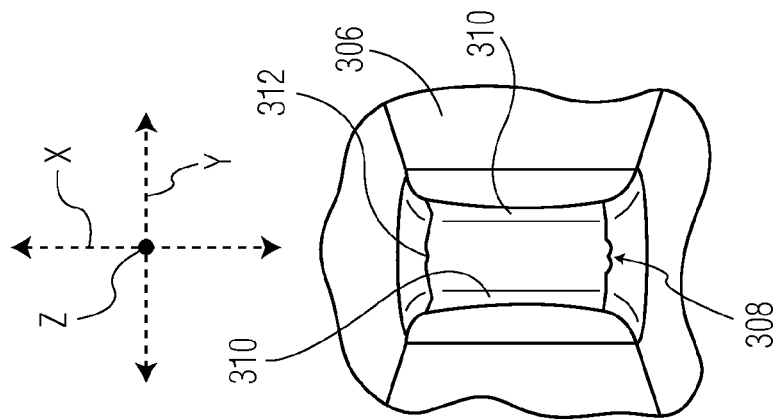
FIGS. 3A-3C are perspective, side, and bottom-up enlarged views, respectively, of a bonding tool tip portion in accordance with an exemplary embodiment of the present invention.
Figure 3B:
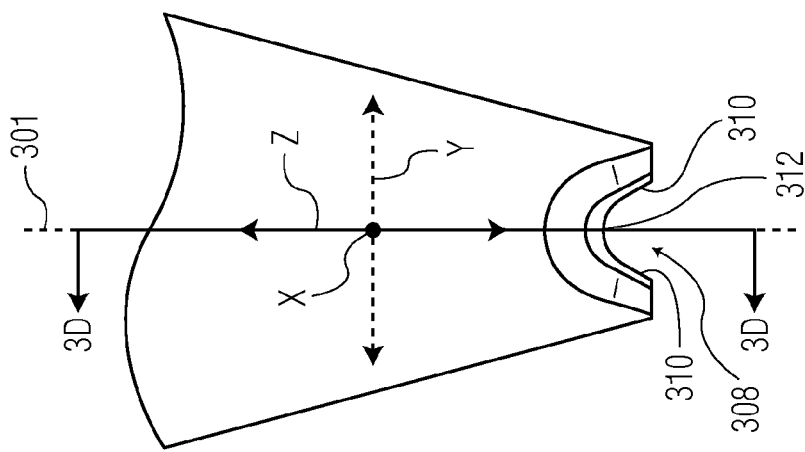
Figure 3A:
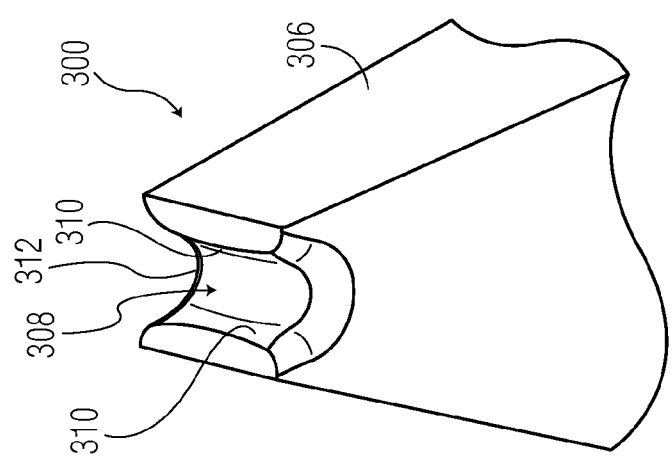
Figure 3D:
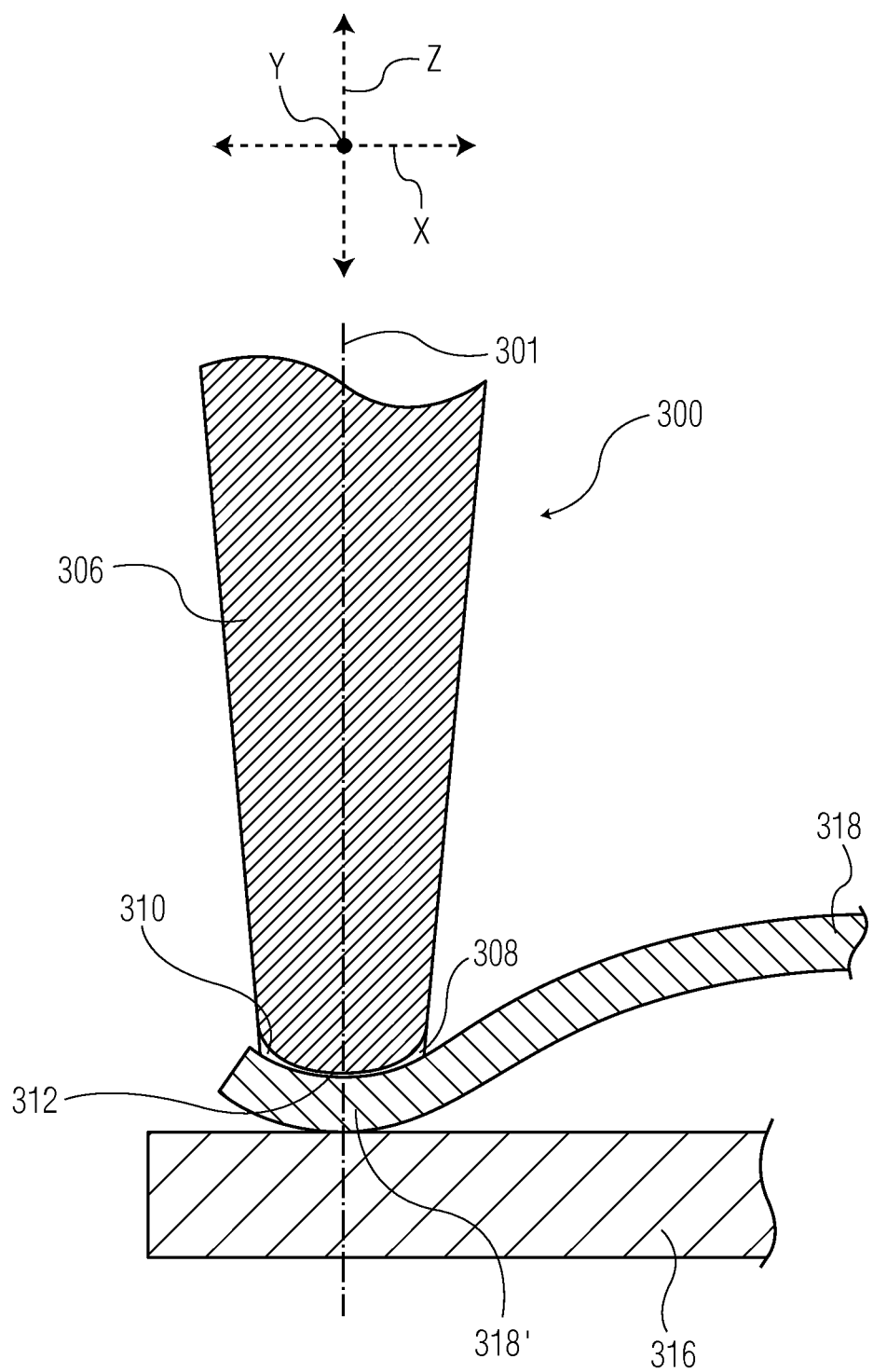
FIG. 3D is an enlarged side, cut away view, of the bonding tool tip portion of FIGS. 3A-3C engaging a portion of a wire to be bonded to an underlying substrate in accordance with an exemplary embodiment of the present invention.

Opposing walls 310 have a curved profile (i.e., the walls follow a curved path as opposed to the flat profiles of opposing walls 110 in FIG. 2A) and meet at apex 312 of groove 308. In characterizing such a curved profile, one may consider that a surface of each of the opposing walls defines respective angles that vary with respect to longitudinal axis 301 (e.g., along an X-axis—see FIG. 3B) of the body portion. As also illustrated in FIG. 3D, such curved profile of the opposing walls are arranged in a mirror image configuration (i.e., is symmetrical) about longitudinal axis 301 (the X-axis). Groove 308 may also be characterized in that it tends to resemble a saddle-shape with a higher portion along the groove axis (i.e., the X-axis in FIG. 3C) midway between its opposing ends, and sloping to respective lower portions at either opposing end as more clearly shown in FIG. 3B. Opposing walls 310 curve inwardly at their midpoints (e.g., see FIG. 3C).

Figure 3E:
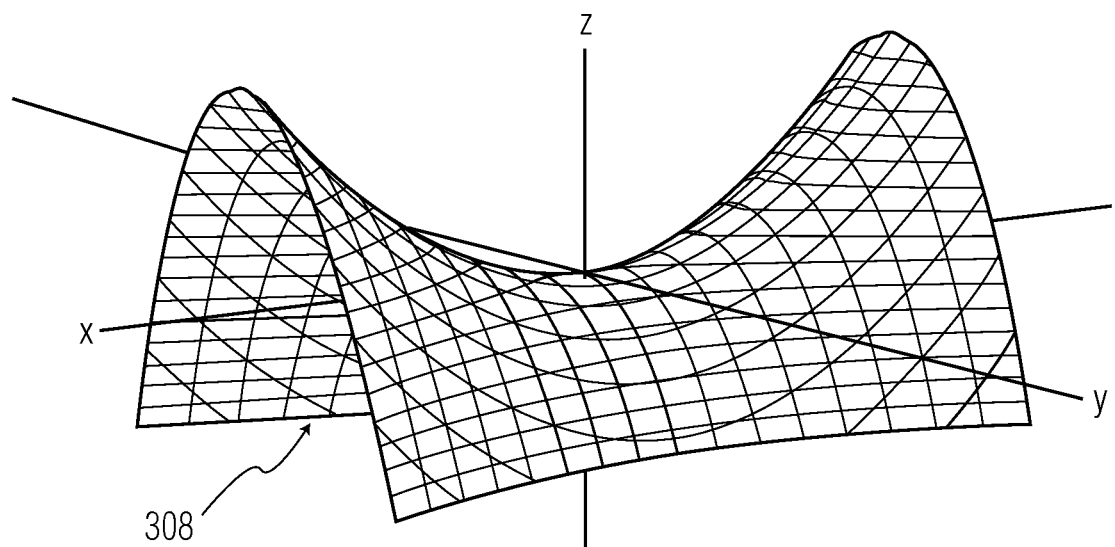
FIG. 3E is a perspective view of a substantially asymmetric hyperbolic paraboloid shape useful in describing a shape of a groove of a bonding tool in accordance with an exemplary embodiment of the present invention.

As one skilled in the art will appreciate, groove 308 defines a substantially hyperbolic paraboloid shape (e.g., see FIG. 3E). For example, groove 308 is a parabola along its groove axis between walls 310 and sections of groove 308 taken at right angles (i.e., the Y-axis) along its length define approximate hyperbolas. In the specific example shown in FIGS. 3A-3E, groove 308 defines a substantially asymmetric hyperbolic paraboloid shape. That is, groove 308 is approximately a parabola along its groove axis, or vertex (or apex 312 of groove 308 along an X-axis), but sections of groove 308 taken at right angles (i.e., the Y-axis) along its vertex define approximate hyperbolas of differing size on either side of the longitudinal axis 301 of bonding tool 300. For example, the smallest approximate hyperboloid may be at the midpoint of groove 308, that is, at longitudinal axis 301 of bonding tool 300, with the largest respective approximate hyperboloids at the opposing ends of groove 308.

Figure 2D:
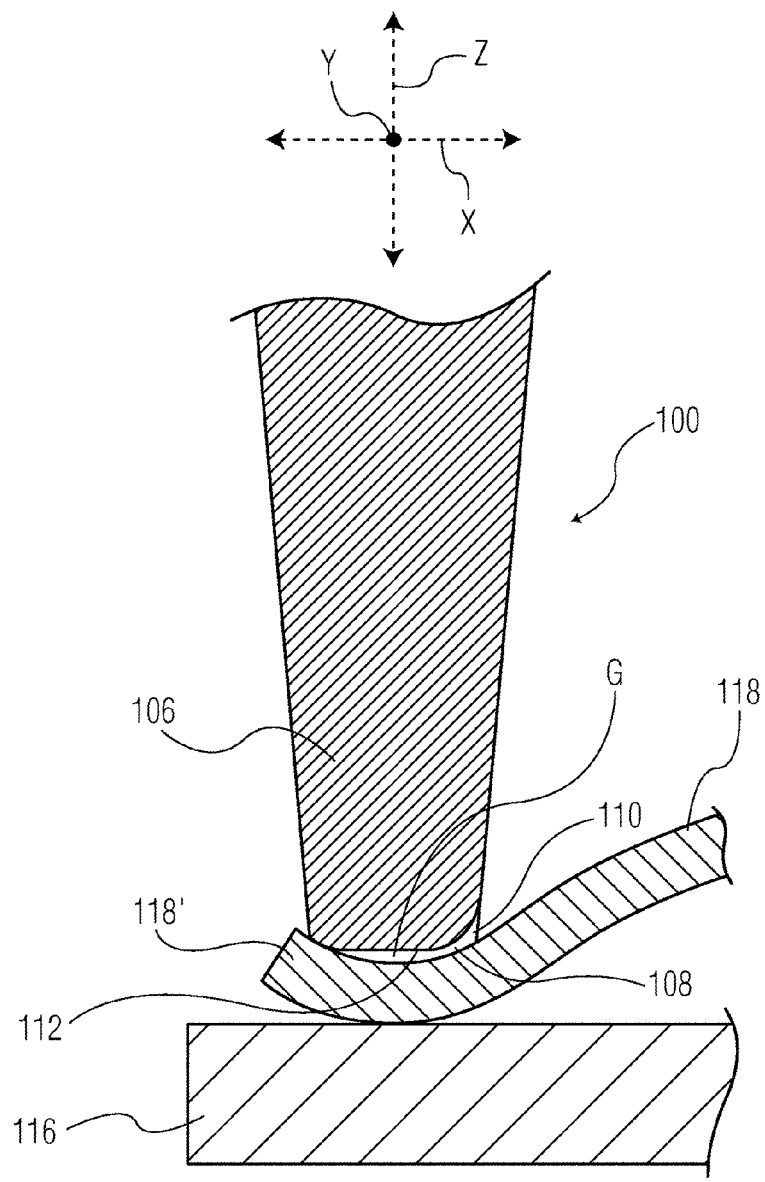
FIG. 2D is an enlarged side, cut away view, of the tip portion of the bonding tool FIGS. 1A-1B engaging a portion of a wire to be bonded to a substrate.

FIG. 3D is an enlarged side view of tip portion 306 of wire bonding tool 300 (e.g., taken along line 3D-3D in FIG. 3B) and more clearly illustrates the curvature of wire portion 318' along an X-axis (and curved apex 312 along which it extends), and thus the inventive shape of wire groove 308 within which portion 318' of wire 318 is engaged. Bonding tool 300 presses engaged portion 318' against substrate 316 to which wire 318 is to be bonded. As compared to conventional wire bonding tool 100 engaging wire 118 (e.g., as shown in FIG. 2D), wire portion 318' is firmly seated within groove 308 about its length and is under substantially consistent pressure within groove 308 while engaged and pressed against substrate 316 by bonding tool 300. Thus, when wire bonding tool 300 presses against wire portion 318' to bond wire 318 to substrate 316 during, for example, an ultrasonic bonding process, wire portion 318' may have a reduced potential for relative movement with bond tip portion 306. Thus, induced vibrations of bonding tool 300 through wire portion 318' and against substrate 316 achieves improved relative movement between wire portion 318' and substrate 316 resulting in an improved bond between wire 318 and substrate 316.

As referred to above and illustrated in FIG. 3E, wire groove 308 (along the X-axis) of the present invention may be comprised of a saddle-shape surface. The sections of the saddle-shaped surface, by planes parallel to one coordinate plane (along the Y-axis) are approximate hyperbolas while those sections by planes parallel to another coordinate plane (along the X-axis) are approximate parabolas. These approximations to parabolic functions vary by both wire diameter and design depth of groove to optimize both wire bond shape and bond tool to wire coupling. This saddle-shape of the bottom of bonding tool 300 defines groove 308, and may be a substantially (asymmetric) hyperbolic paraboloid shape, and, if the coordinate axes X, Y, and Z are as shown in FIG. 3E, may be approximated by the formula:

$$x^2/a^2 - y^2/b^2 = z/c$$

where "x", "y" and "z" represent the Cartesian Coordinates of a point on the substantially asymmetric hyperbolic paraboloid shape shown in FIG. 3E, and "a", "b", and "c" are constants (coefficients) and not zero.

The groove shape of FIGS. 3A-3E (and of other embodiments described herein) may permit curved wire portion 318' to be gripped by the surface of bonding tool 300 that defines groove 308 such that relative movement between bonding tool 300 and wire portion 318' may be reduced—and that the relative movement between wire portion 318' and underlying substrate 316 may be increased to achieve a stronger and more robust bond between wire 318 and substrate 316.

Figure 4C:
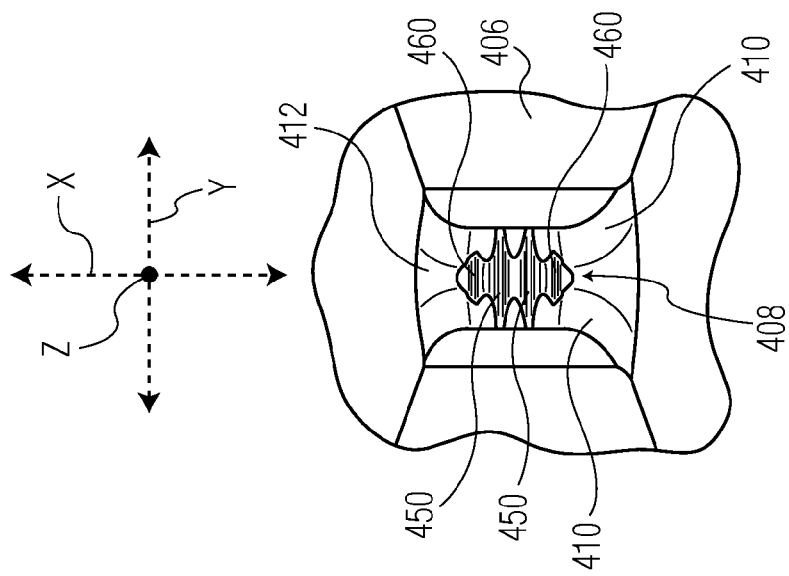
FIGS. 4A-4C are perspective, side, and bottom-up enlarged views, respectively, of a bonding tool tip portion in accordance with another exemplary embodiment of the present invention.
Figure 4B:
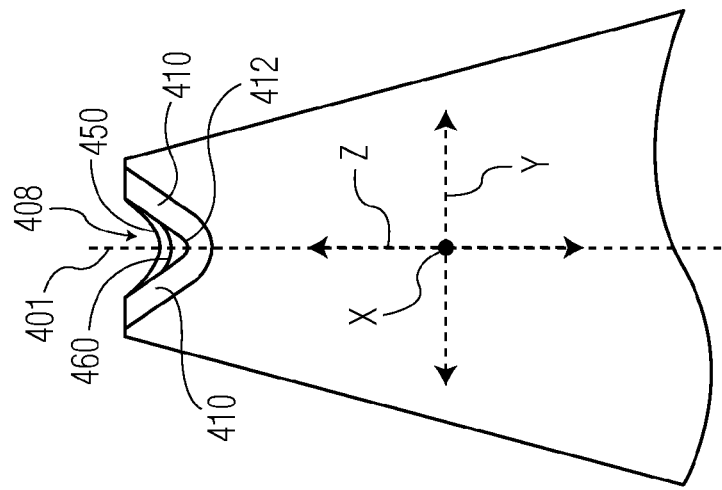
Figure 4A:
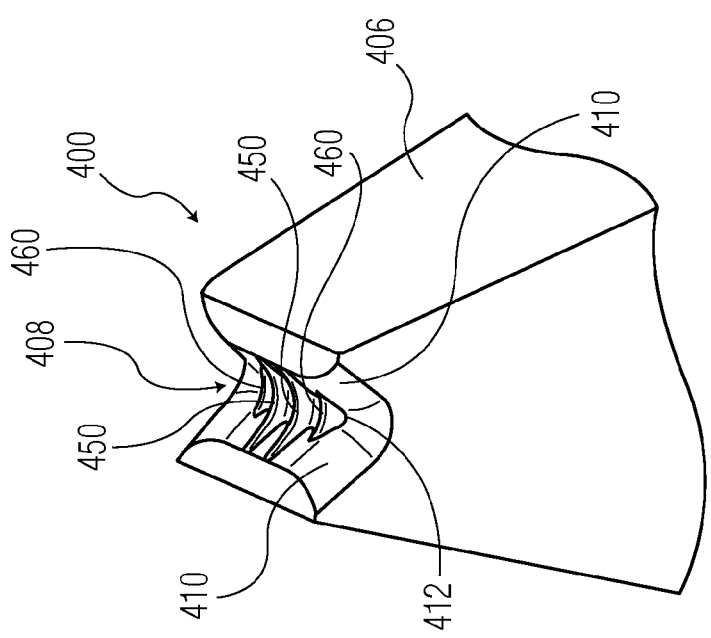

FIGS. 4A-4C illustrate another exemplary embodiment of the present invention. Wire bonding tool 400 includes ridges 450, 460 configured to engage a length of wire before, and/or during, bonding of the wire by bond tool 400 (where tool 400 defines longitudinal axis 401) against an underlying substrate. Groove 408, defined by opposing walls 410, and having apex 412, extends along a groove axis (the X-axis in FIG. 4C). Similar to groove 308 described above, groove 408 is saddle-shaped (e.g., a substantially hyperbolic paraboloid shape, a substantially asymmetric hyperbolic paraboloid shape, etc.). As more clearly illustrated in FIGS. 4A and 4C, tool tip portion 406 includes a pair of ridges 450 extending between upper portions of opposing walls 410, flanked by a pair of ridges 460 that extend between lower portions of opposing walls 410. A wire engaged by bond tip portion 406 fits within groove 408 and may be engaged by ridges 450 (and perhaps ridges 460), such that ridges 450, 460 may press into the wire before (and/or during), ultrasonic bonding of the wire to a substrate. Ridges 450, 460 tend to improve the grip of bond tip portion 406 to the wire, resulting in improved bonding of the wire to the underlying substrate.

While FIGS. 4A-4C include one pattern of ridges 450, 460, it is understood that different ridge configurations are contemplated. For example, FIGS. 5A-5C, 6A-6C, and 7A-7E illustrate additional examples. Of course additional configurations (with any number of ridges, where the ridges may be the same or different from one another) are contemplated. FIGS. 5A-5C illustrate tip portion 506 of wire bonding tool 500 (extending along longitudinal axis 501—the illustrated Z-axis) which includes a pair of parallel spaced apart ridges 550 having protrusions, such as teeth, within groove 508. Ridges 550 are configured to engage a length of wire before, and during, bonding of the wire against an underlying substrate. Groove 508, defined by opposing walls 510, and having apex 512, extends along a groove axis (the illustrated X-axis) and has a saddle-shape (e.g., a substantially hyperbolic paraboloid shape, a substantially asymmetric hyperbolic paraboloid shape, etc.). A wire engaged by bond tip portion 506, fits within groove 508 and is engaged by pair of toothed ridges 550 such that toothed ridges 550 may press into the wire before and during ultrasonic bonding of the wire to a substrate. Toothed ridges 550 may improve the grip of bond tip portion 506 against the wire resulting in improved bonding of the wire to the underlying substrate.

Figure 6C:
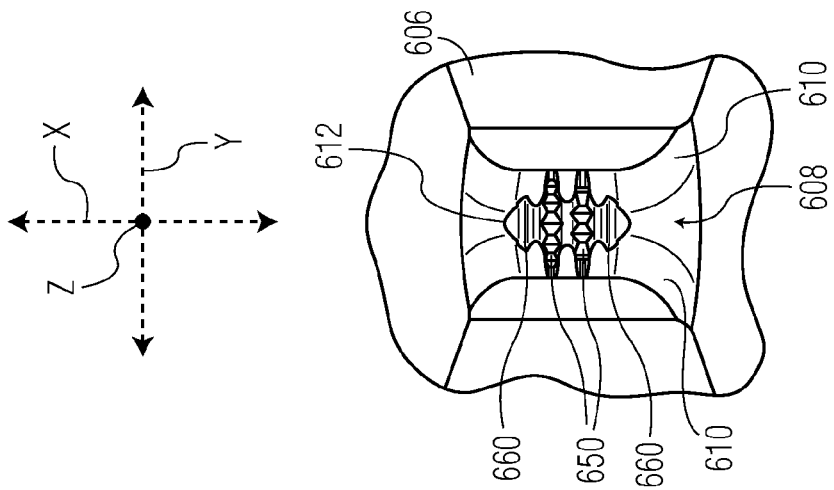
FIGS. 6A-6C are perspective, side, and bottom-up enlarged views, respectively, of a bonding tool tip portion in accordance with yet another exemplary embodiment of the present invention.
Figure 6B:
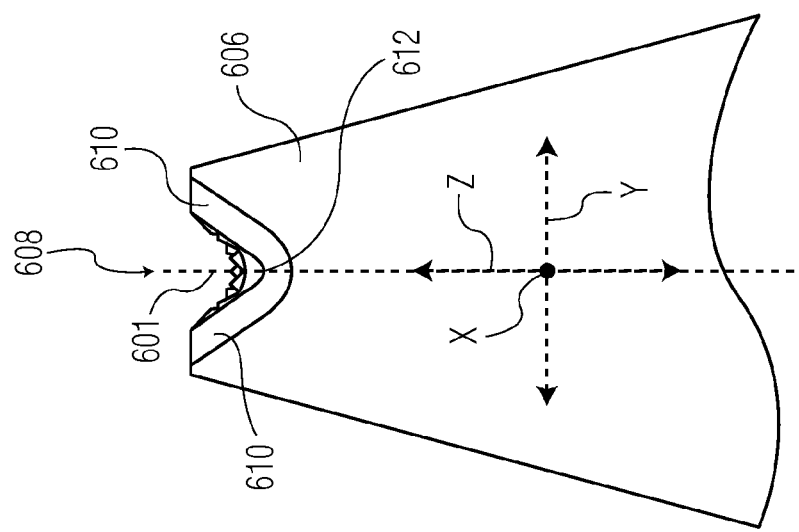
Figure 6A:
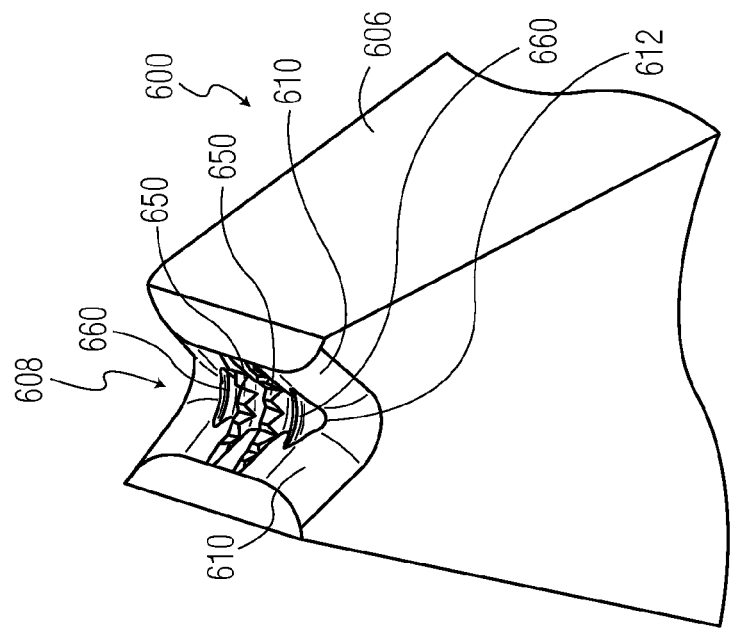
Figure 7C:
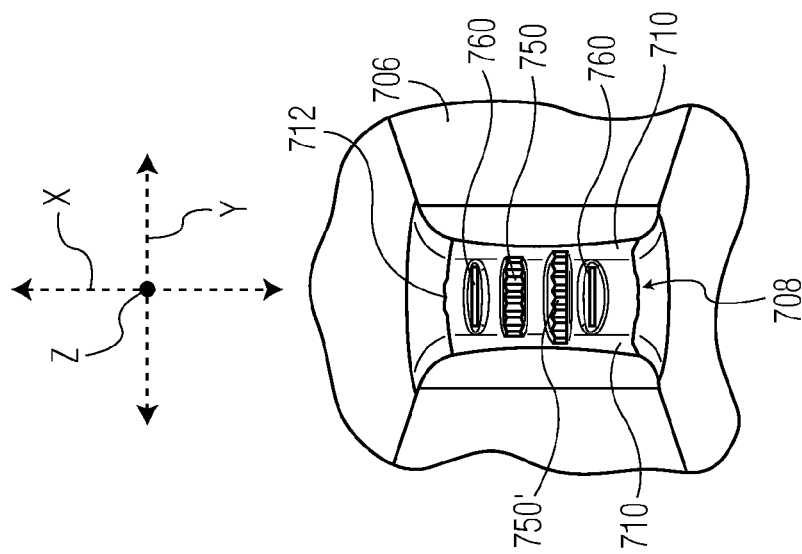
FIGS. 7A-7C are perspective, side, and bottom-up enlarged views, respectively, of a bonding tool tip portion in accordance with yet another exemplary embodiment of the present invention.
Figure 7B:
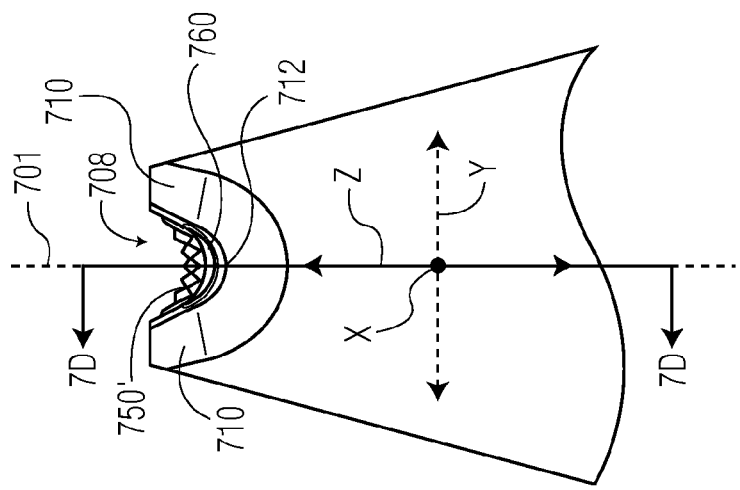
Figure 7A:
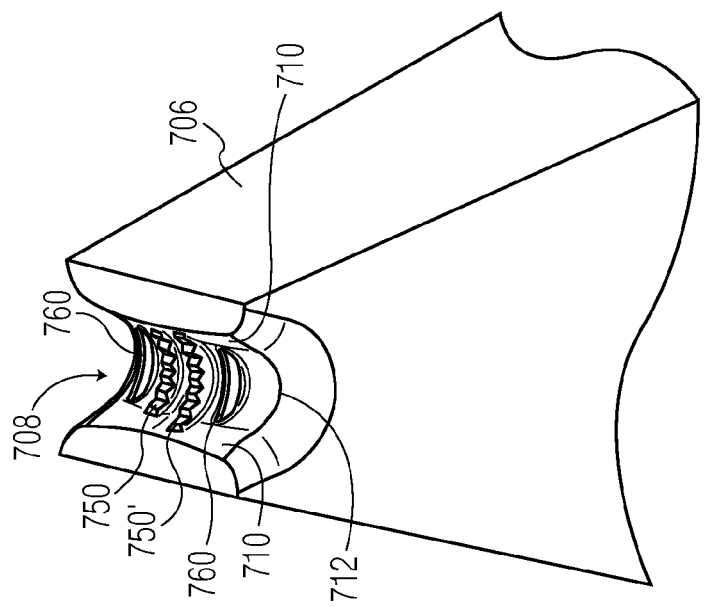

FIGS. 6A-6C illustrate tip portion 606 of wire bonding tool 600 (extending along longitudinal axis 601, the illustrated Z-axis. Bonding tool 600 includes a pair of parallel, spaced apart ridges 650 having protrusions, such as teeth, flanked by a pair of parallel ridges 660 (without protrusions), at its tip portion 606. Groove 608, defined by opposing walls 610, and having apex 612, extends along a groove axis (the illustrated X-axis), and has a saddle-shape (e.g., a substantially hyperbolic paraboloid shape, a substantially asymmetric hyperbolic paraboloid shape, etc.). As more easily seen in FIGS. 6A and 6C, tool tip portion 606 includes toothed ridges 650 extending from the upper portions of opposing walls 610, and ridges 660 extending between the lower portions of opposing walls 610. A wire engaged by bond tip portion 606, fits within groove 608 and may be engaged by toothed ridges 650 (and ridges 660), such that ridges 650, 660 each may press into the wire, before and/or during ultrasonic bonding of the wire to a substrate. Toothed ridges 650 and ridges 660 may improve the grip of bond tip portion 606 against the wire.

FIGS. 7A-7D illustrate tip portion 706 of wire bonding tool 700 (that extends along longitudinal axis 701—the illustrated Z-axis). Tip portion 706 includes parallel spaced apart ridges 750, 750' having protrusions (e.g., teeth), flanked by a pair of parallel ridges 760 without protrusions. Ridges 750, 750', 760 are configured to engage a length of wire before, and/or during, bonding of the wire by bond tool 700 against an underlying substrate. Groove 708, defined by opposing walls 710, and having apex 712, extends along a groove axis (the illustrated X-axis), and has a saddle-shape (e.g., a substantially hyperbolic paraboloid shape, a substantially asymmetric hyperbolic paraboloid shape, etc.). Toothed ridge 750' has asymmetric protrusions, that is, the lengths of some of its teeth may be unequal, and/or such teeth extend in differing directions. This may further increase the engagement of bond tip portion 706 to a wire to be bonded by the bonding tool 700.

It is noted that ridge 750' is higher than ridges 750, 760 such that ridge 750' may make first contact of the portion of wire to be bonded. A wire engaged by bond tip portion 706, fits within groove 708 and may be engaged by toothed ridges 750, 750' and smooth ridges 760 such that one or more ridges 750, 750', 760 may press into the wire before and/or during ultrasonic bonding of the wire to a substrate. Toothed ridges 750, 750' and ridges 760 (without protrusions) each, or together, may improve the grip of bond tip portion 706 against the wire to achieve improved bonding of the wire to the underlying substrate.

FIGS. 7D-7E depict use of bonding tool 700 in a prebonding state of bonding wire 718 to substrate 716 (with FIG. 7E a partial cut-away perspective view). Groove 708 of bonding tip portion 706 engages wire portion 718' of wire 718 above substrate 716. FIG. 7E more clearly illustrates the engagement of wire portion 718' with protruded ridges 750, 750' (e.g., toothed ridges), and ridges 760 (without protrusions). As illustrated at arrows 770, toothed ridge 750 includes asymmetric teeth, that is, one or more teeth having a longer length than other teeth. Outer ridge 760, and inner toothed ridges 750, 750', have been at least partially pressed into the upper surface of wire portion 718', but opposing outer ridge 760 has not yet been pressed into wire portion 718'. During bonding (not shown), tool 700 is pressed further into wire portion 718' (with or without ultrasonic energy) such that all ridges 750, 750', 760 may be pressed into the wire. The ridge design, and the groove design, may serve to improve coupling between wire portion 718' and bonding tool 700.

Figure 8:
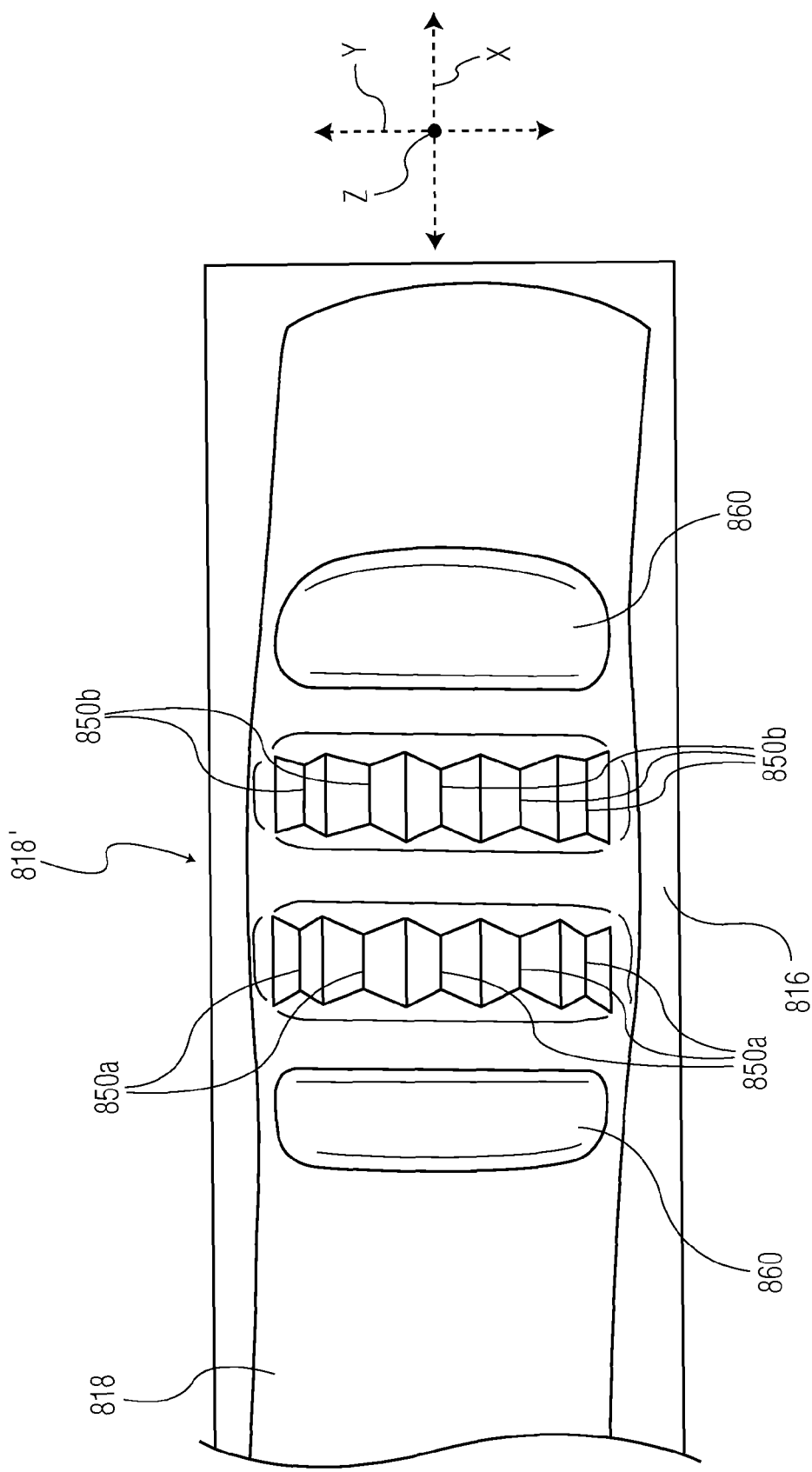
FIG. 8 is top down, plan view of a portion of a wire bonded to an underlying substrate using a bonding tool in accordance with an exemplary embodiment of the present invention.

FIG. 8 is top down, plan view of a portion of a wire bonded to an underlying substrate in accordance with another exemplary embodiment of the present invention. FIG. 8 illustrates wire portion 818' of wire 818 that has been bonded to underlying substrate 816 using bonding tool 700 (as illustrated in FIGS. 7A-7E). Impressions 850a, 850b, with indents from protrusions were formed by respective toothed ridges 750, 750', and non-indented impressions 860 were formed by respective ridges 760 (without protrusions).

The use of ridges with protrusions (e.g., teeth) in the instant invention may further facilitate embedding of those ridges into the wire portion. While the ridges may be substantially perpendicular to a groove axis, they may also be positioned at various other positions. As provided above, any of a number of ridges, of varying designs (e.g., with or without protrusions, of varying heights, etc.) are contemplated.

While the present invention may be used in connection with any type of wire bonding (e.g., gold, aluminum, etc.), it may have particular applicability in copper wire bonding.

As will be appreciated by those skilled in the art, if multiple ridges are provided in the groove of a bonding tool, each of the ridges (and associated wire bonding system) may be configured to contact the wire simultaneously, or at different times, as desired.

Although the present invention has been described primarily in terms of wire bonding, it is not limited thereto. The teachings of the present invention have application in any of a number of ultrasonic bonding applications such as ribbon wire bonding.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A wire bonding tool comprising a body portion terminating in a tip portion, the tip portion including opposing walls defining a groove, each of the opposing walls having a curved profile, the wire bonding tool including at least one ridge extending between and joining the opposing walls.

2. The wire bonding tool of claim 1 wherein a surface of each of the opposing walls defines respective angles that vary with respect to a longitudinal axis of the body portion such that each of the opposing walls has the curved profile.

3. The wire bonding tool of claim 2 wherein each of the opposing walls has the curved profile arranged in a mirror image configuration about the longitudinal axis.

4. The wire bonding tool of claim 1 wherein each of the opposing walls having a plurality of curved profiles, each of the plurality of curved profiles extending in different directions from one another.

5. The wire bonding tool of claim 4 wherein the different directions are substantially perpendicular to one another.

6. The wire bonding tool of claim 1 wherein the groove extends along a groove axis, and a surface of the opposing walls define respective angles that vary with respect to the groove axis such that each of the opposing walls has the curved profile.

7. The wire bonding tool of claim 1 wherein the opposing walls meet at an apex of the groove, the apex defining a curved shape in a direction of the groove.

8. The wire bonding tool of claim 1 wherein the wire bonding tool is a ribbon wire bonding tool.

9. The wire bonding tool of claim 1 wherein the wire bonding tool includes a plurality of the ridges extending between and joining the opposing walls, wherein at least one of the plurality of ridges has a height that is different from at least one other of the plurality of ridges.

10. The wire bonding tool of claim 1 wherein the groove extends along a groove axis, and the at least one ridge extends substantially perpendicular to the groove axis.

11. The wire bonding tool of claim 1 wherein the at least one ridge includes a plurality of protrusions extending away from a surface of the at least one ridge.

12. The wire bonding tool of claim 11 wherein a height of the plurality of protrusions varies with respect to the surface of the at least one ridge.

13. The wire bonding tool of claim 1 wherein the wire bonding tool includes a plurality of the ridges extending between and joining the opposing walls.

14. The wire bonding tool of claim 13 wherein the plurality of ridges are substantially parallel to one another.

15. The wire bonding tool of claim 13 wherein at least one ridge of the plurality of ridges includes a plurality of protrusions extending away from a surface of the at least one ridge.

16. The wire bonding tool of claim 15 wherein the at least one ridge of the plurality of ridges including the plurality of protrusions is positioned between others of the plurality of ridges, the others of the plurality of ridges not including the plurality of protrusions.

17. The wire bonding tool of claim 1 wherein the groove defines a substantially hyperbolic paraboloid shape.

18. The wire bonding tool of claim 1 wherein the groove defines a substantially asymmetric hyperbolic paraboloid shape.

19. A wire bonding tool comprising a body portion terminating in a tip portion, the tip portion defining a groove configured to receive a length of wire, the groove defining a substantially asymmetric hyperbolic paraboloid shape.

20. The wire bonding tool of claim 19 further including at least one ridge extending between opposing walls of the tip portion defining the groove.

21. The wire bonding tool of claim 20 wherein the at least one ridge includes a plurality of protrusions extending away from a surface of the at least one ridge.

22. The wire bonding tool of claim 19 further including a plurality of ridges extending between opposing walls of the tip portion defining the groove.

23. The wire bonding tool of claim 22 wherein the plurality of ridges are substantially parallel to one another.

24. The wire bonding tool of claim 22 wherein at least one ridge of the plurality of ridges includes a plurality of protrusions extending away from a surface of the at least one ridge.

25. The wire bonding tool of claim 22 wherein at least one ridge of the plurality of ridges includes a plurality of protrusions extending away from a surface of the at least one ridge, the at least one ridge having the plurality of protrusions is positioned between others of the plurality of ridges, the others of the plurality of ridges not including the plurality of protrusions.

26. A wire bonding tool comprising a body portion terminating in a tip portion, the tip portion including opposing walls defining a groove, and at least one ridge extending between the opposing walls, wherein at least one of: (a) a surface of each of the opposing walls defines respective angles that vary with respect to a longitudinal axis of the body portion such that each of the opposing walls has a curved profile; and (b) each of the opposing walls has a plurality of curved profiles, each of the plurality of curved profiles extending in different directions from one another.

27. The wire bonding tool of claim 26 wherein the surface of each of the opposing walls defines the respective angles that vary with respect to the longitudinal axis of the body portion such that each of the opposing walls has the curved profile.

28. The wire bonding tool of claim 27 wherein each of the opposing walls has the curved profile arranged in a mirror image configuration about the longitudinal axis.

29. The wire bonding tool of claim 26 wherein each of the opposing walls has the plurality of curved profiles, each of the plurality of curved profiles extending in different directions from one another.

30. The wire bonding tool of claim 29 wherein the different directions are substantially perpendicular to one another.

31. The wire bonding tool of claim 26 wherein the groove extends along a groove axis, and a surface of the opposing walls define respective angles that vary with respect to the groove axis such that each of the opposing walls has the curved profile.

32. The wire bonding tool of claim 26 wherein the opposing walls meet at an apex of the groove, the apex defining a curved shape in a direction of the groove.

33. The wire bonding tool of claim 26 wherein the wire bonding tool is a ribbon wire bonding tool.

34. The wire bonding tool of claim 26 wherein the groove extends along a groove axis, and the at least one ridge extends substantially perpendicular to the groove axis.

35. The wire bonding tool of claim 26 wherein the at least one ridge includes a plurality of protrusions extending away from a surface of the at least one ridge.

36. The wire bonding tool of claim 35 wherein a height of the plurality of protrusions varies with respect to the surface of the at least one ridge.

37. The wire bonding tool of claim 26 further including a plurality of ridges extending between the opposing walls.

38. The wire bonding tool of claim 37 wherein the plurality of ridges are substantially parallel to one another.

39. The wire bonding tool of claim 37 wherein at least one ridge of the plurality of ridges includes a plurality of protrusions extending away from a surface of the at least one ridge.

40. The wire bonding tool of claim 39 wherein the at least one ridge of the plurality of ridges including the plurality of protrusions is positioned between others of the plurality of ridges, the others of the plurality of ridges not including the plurality of protrusions.

41. The wire bonding tool of claim 26 wherein the groove defines a substantially hyperbolic paraboloid shape.

42. The wire bonding tool of claim 26 wherein the groove defines a substantially asymmetric hyperbolic paraboloid shape.

* * * * *